United States Patent [19]

Riegert

[11] 4,124,472

[45] Nov. 7, 1978

[54] PROCESS FOR THE PROTECTION OF WEAR SURFACES

[76] Inventor: Richard P. Riegert, 701 E. Victoria St., Santa Barbara, Calif. 93103

[21] Appl. No.: 772,515

[22] Filed: Feb. 28, 1977

[51] Int. Cl.² .............................................. C23C 15/00
[52] U.S. Cl. ............................................. 204/192 EC
[58] Field of Search ..................... 204/192 C, 192 EC

[56] References Cited

U.S. PATENT DOCUMENTS

| 3,709,809 | 1/1973 | Wright et al. | 204/192 C |
| 3,755,123 | 8/1973 | Davidse et al. | 204/192 EC |

OTHER PUBLICATIONS

J. L. Mukherjee et al., "Influence of Ar Sputtering Pressure on the Adhesion of TiC Films to Steel Substrates", *J. Vac. Sci. Tech.*, vol. 12, pp. 850-853 (1975).
W. W. Carson, "Sputter Gas Pressure & D.C. Substrate Bias Effects on Thick RF-Diode Sputtered Films of Ti Oxycarbides", *J. Vac. Sci. Tech.*, vol. 12, pp. 845-849 (1975).
R. Bland et al., "Effect of Ion Bombardment During Deposition on Thick Metal & Ceramic Deposits", *J. Vac. Sci. Tech.*, vol. 11, pp. 671-674 (1974).

*Primary Examiner*—John H. Mack
*Assistant Examiner*—Aaron Weisstuch
*Attorney, Agent, or Firm*—Keith D. Beecher

[57] ABSTRACT

A process for the protection of wear surfaces is provided which comprises applying a micro-thin film of hard material to the surface of a substrate of softer and preferably tougher material, the film being elastically compliant and remaining intact even when plastic deformation of the substrate material occurs. In the practice of the process of the invention, the micro-thin film of hard material does not achieve its own modulus of rigidity and, therefore, does not directly absorb impact energy, but transmits the energy to the substrate material for absorption.

4 Claims, 14 Drawing Figures

ELASTIC INTERCHANGE--NO DEBRIS

PROCESS FOR THE PROTECTION OF WEAR SURFACES

BACKGROUND OF THE INVENTION

When the surfaces of two bodies are brought into juxtaposition with one another under static conditions, the contact between the two surfaces does not exist over the entire area. This is because, on an atomistic basis, all surfaces, no matter how flat and no matter how highly polished, have asperities. For example, when one of the bodies is statically placed on top of the other, there are a number of asperity contacts, and the asperities are elastically deformed so that the contact area involved in bearing the load equals the unit strength of the material of the load-bearing body. If the load increases, the asperities are further elastically deformed and other lower level asperities are contacted and deformed. The deformation of the asperities will remain within the elastic limits of the material of the load-bearing body unless the load increases to an extent that the deformation extends beyond the elastic limits of the material.

Now, should the two bodies be moved relative to one another in a sliding contact, there will be a continual redistribution of the loading between the asperities, with the contact area always being dynamically equal to the unit load-bearing capacity of the material forming each of the two bodies. In time, as the two contacting surfaces wear into one another, plastic deformation of the asperities will occur and the two surfaces will become smoother. During the wear-in process, however, the asperities are sheared to some extent, and a certain amount of debris is generated. In the absence of a lubricant, the debris is smeared across the contacting surfaces and micro-fusion often occurs so that the contacting surfaces are continuously subjected to a welding, and to a shearing action, and the interface rapidly increases in temperature causing the contacting surfaces quickly to deteriorate and fail.

When a lubricant is used, the generated debris is carried by the lubricant. Since the lubricant is nearly incompressible, one of its functions is to serve as a load-bearing medium which distributes the load over large areas of the contacting surfaces and thereby inhibits drastic asperity contacts. The lubricant also serves as a cooling agent for the micro-fusion action.

The usual prior art practice in the case of two contacting bodies which are to engage one another in a rolling or sliding contact is to form the two bodies of a tough material. However, tough materials have high friction coefficients because their contact energy is high. The solution is this dilemma from earliest times has been to introduce lubricants into the contact area. Hard materials, on the other hand, have low friction coefficients and have very high melting points, and are more suited than tough materials for providing sliding or rolling contact surfaces. However, hard materials are universally brittle, and as such cannot in and of themselves absorb much impact energy.

The process of the present invention makes use of the superior properties of hard materials as bearing surfaces by providing a micro-thin film of a hard material on a substrate formed of softer and preferably tougher material. In the process of the invention, the hard material film is made sufficiently thin so that it cannot establish its own identifiable modulus of rigidity, and so that essentially all impact energy is transmitted through the micro-thin-film of hard material to the tough substrate which is capable of absorbing it. Thus, in the practice of the invention, the hard material film serves its function of providing a low friction contact surface, and the high friction tough material of the substrate is held out of engagement with the contacting surfaces, but serves to absorb all impact energy therefrom. The hard material film is preferably prepared with sufficient defects to obviate the formation of grain boundaries therein, for reasons to be explained.

The provision of the micro-thin-film of hard material on the softer substrate in accordance with the process of the invention serves to maintain the surface film intact, even though plastic deformation may occur of the asperities of the substrate below the overlying hard surface film. By this technique, the surface does not have any tendency to generate debris or increase friction coefficients through micro-welding. The micro-thin-film serves to peen down the underlying substratum surface, so that the friction coefficient is actually reduced because the elastic energy required in continual asperity deformation is minimized. With the extremely smooth surface provided by the hard material micro-thin-film in accordance with the process of the invention, the unit load borne by the surface is reduced because the total load is distributed over a larger region than that which is just required to support the load, as would be the case without the film. Plastic deformation now occurs within the interior of the substrate body when the film is present, rather than on the surface of the body. This internal plastic deformation will be referred to herein as "endoplastic deformation".

In summary, the present invention is concerned with a process by which a hard material is intimately bonded to a substrate of a softer and preferably tougher material as a film of micro-dimensions, such that any impact energy is absorbed by the substrate and not by the film itself. The film, therefore, remains intact and is fully compliant with the substrate as the asperities of the substrate are reduced in size by the load. The film is maintained thin enough so that it does not establish its own modulus of rigidity, and so that it exhibits an unusual amount of elastic displacement capacity. In addition, a high degree of disorder is maintained in the hard surface film so that grain boundary failure does not exist.

DETAILED DESCRIPTION OF THE ILLUSTRATED EMBODIMENT

As described above, when a first solid surface comes in contact with a second solid surface under static loading conditions, the contact region, when viewed on an atomic scale, involves the contact of asperities in each surface even when both surfaces are highly polished. In the simplest case, the static load causes contact asperities on both surfaces to deform elastically to a degree where the product of the unit strength of the material and the contact area just equals the applied load.

If subsequently the load is increased, the asperities-/asperity contact is further compressed and other lower level asperities are brought into play so that the new total contact area-to-unit strength product just equals the new load. In other words, the materials forming the two surfaces are always loaded to their ultimate strengths, and the total contact area is increased or decreased as the load increases or decreases. This case exists whenever the asperity displacement is within the elastic limits of the materials.

Now, should the contacting surfaces be caused to move laterally with respect to one another under applied loads, the dynamic transfer of asperities/asperity contact proceeds. If the action is totally within the elastic limits of the materials, the tribological energy consumed during the action is constant and no dbris is generated. However, such an idealized condition is virtually never experienced. A unique aspect of the contacting surfaces prepared in accordance with the process of the present invention is that, except for endoplastic deformation, the energy exchanged between the moving surfaces is nearly totally elastic.

In order that the basic principles upon which the process of the invention is predicated may be fully understood, the usual modes of energy exchange between surfaces, and the nature of failure associated with such energy exchange, will now be discussed.

Figure 1A:
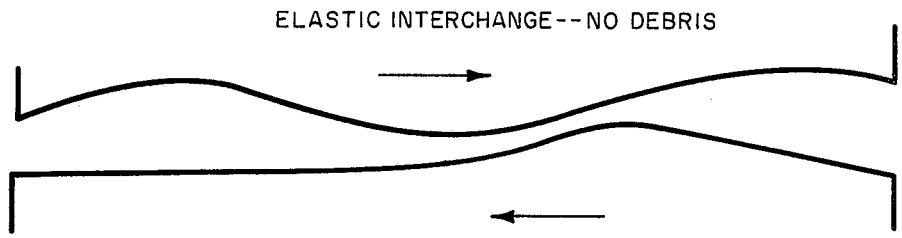
FIGS. 1A and 1B are schematic representations of two surface asperities moving in opposite directions relative to one another.
Figure 1B:
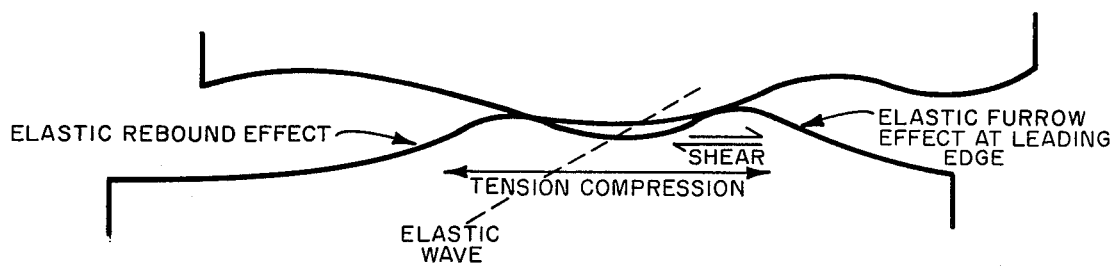

Five primary methods of interchange of tribological energy have been identified. First, a total elastic interchange in which no debris is generated, and where the asperities return to their original condition after elastic displacement on passing through a mutual contact zone is shown in FIGS. 1A and 1B. All failures occur only when the elastic limit of the material has been exceeded. The four major modes of failure to be discussed may be termed elasto-fractive interchange (FIGS. 3A and 3B); elastoplastic interchange (FIGS. 4A and 4B); furrow-shear interchange (FIGS. 5A and 5B); and plastic platelet interchange (FIGS. 6A, 6B and 6C). It might be noted that in most cases involving plastic deformation, more than one of the aforesaid failures take place simultaneously.

As stated above, FIGS. 1A and 1B are representations of two surface asperities moving in opposite directions relative to one another (FIG. 1A). First, the lower asperity only will be considered without considering the effect on the upper asperity, this being shown in FIG. 1B, in which the inclination of the lower asperity is elastically deformed as if the upper asperity were rigid. If the maximum stress does not exceed the elastic limit of the material, tne energy interchange is totally elastic.

The deformation of the lower asperity is such to form a leading edge furrow of material elastically displaced by the energy wave passing through it. The forward portion of the elastic wave induces compressive forces inside the asperity, and there are tensile forces behind the elastic wave. The induced furrow will have a shear force tending to remove the top of the asperity. The region of maximum stress is at the intersection of the elastic wave and the shear zone, and is inside the material rather than along the surface.

Now, the fact should be considered that the inclination to establish a forward furrow effect, and the inclination to establish an elastic rebound displacement at the trailing edge of the interface zone of the lower asperity, will be inhibited by the concomitant inclination of the upper asperity to occupy the same space and to establish a reciprocal leading edge furrow and trailing edge elastic rebound displacement in the vertical direction. Both asperities cannot occupy the same space and, therefore, each must be mutually displaced, and each asperity mutually resists the displacement by the other in the vertical direction. As a result, the displaced volume of the lower leading edge furrow is deformed by the elastic rebound of the upper trailing edge, and a mutual vertical compressive force is established. The displaced volume can be moved only forward and rearward of the original dimensions of the lower asperity.

Figure 2A:
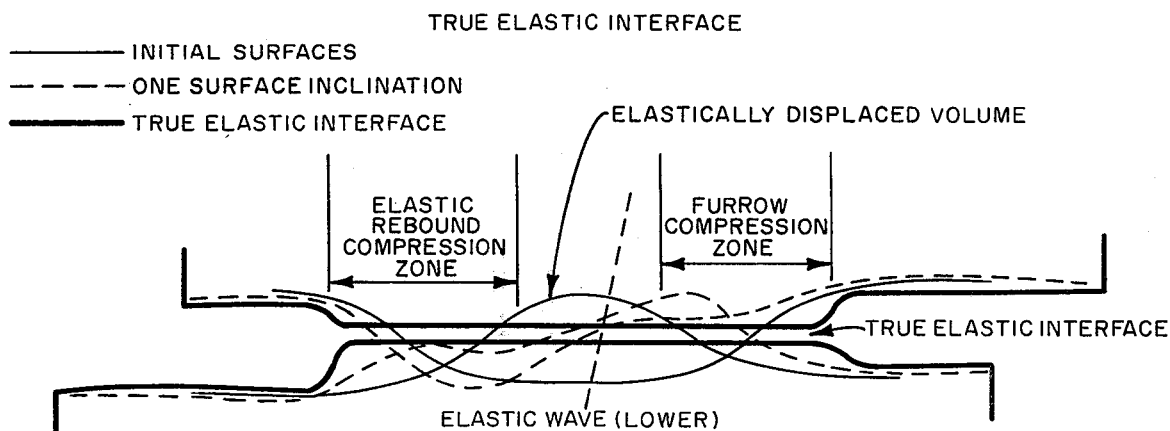
FIGS. 2A and 2B are schematic representations of the two surfaces when the elastic limits of the asperities have not been exceeded.
Figure 2B:
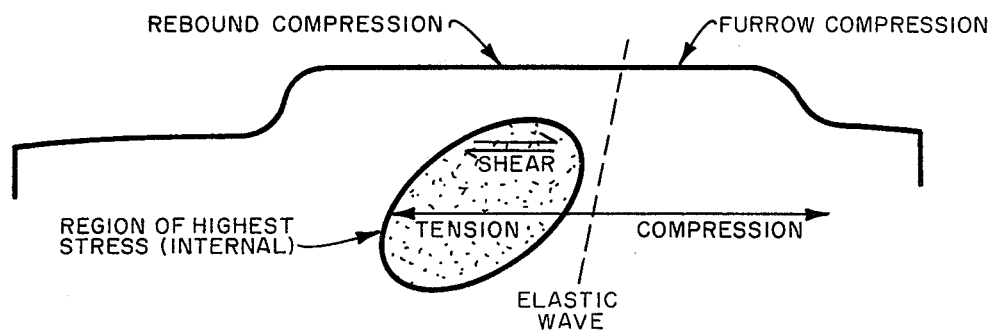

The true elastic interface between the asperities is normalized into a single contact surface for the sake of simplicity and is illustrated as a plane in FIG. 2A. A rough force diagram for the lower asperity is shown in FIG. 2B.

The elastic wave being transmitted through the lower asperity has a forward looking compressive component, and an after looking tensile component. Superimposed on this is the mutual surface compressive force of the upper asperity in the forward zone resulting from furrow generation which is now buried below the surface. As can be seen from the force diagram of FIG. 2B, the tensile segment of the elastic wave is surrounded completely by regions of compressive force. The region of highest stress is at the intersection of the elastic wave and the shear zone, and this region is in the interior portion of the lower asperity and not on the surface. The force diagram of FIG. 2B will be referenced later in the discussion of endoplastic deformation in conjunction with FIG. 7.

As noted above, in virtually all tribological applications, pure elastic interchange does not occur since the elastic limit of some of the asperities in most instances is always exceeded. When this elastic limit is exceeded, a variety of failure modes occurs depending on the nature of the material, on the relative speed of asperity contact, and on the size or shape of the asperities. The four methods of failure which have been identified will now be described.

Figure 3A:
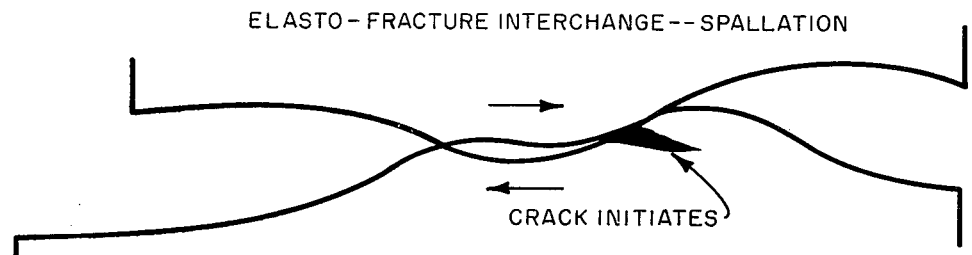
FIGS. 3A and 3B are schematic representations of the surfaces when the elastic limit of the asperities has been exceeded.
Figure 3B:
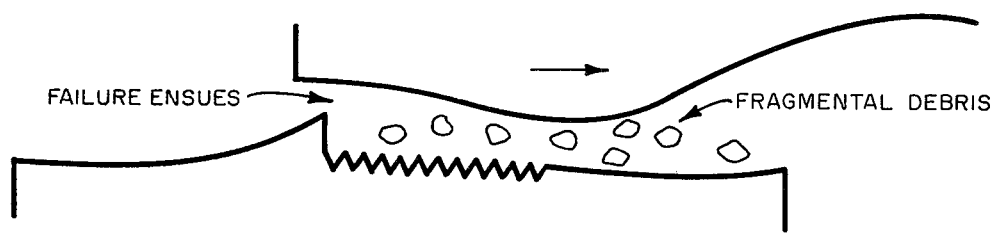

The first method of failure illustrated schematically in FIGS. 3A and 3B is elasto-fractive, or brittle, failure. Brittle failure occurs if the elastic limit is exceeded in a brittle material, or if the applied stress rate on a ductile material asperity exceeds the velocity of propagation of an elastic wave in that material. The nature of brittle failure is such that the energy required to propagate a crack, once the crack has been initiated, is very small.

As can be seen in FIG. 3A, when the elastic limit of an asperity has been exceed, and when a crack has been initiated, failure ensues and fragmented debris results. The fragmented debris then induces a high friction coefficient as it, in turn, becomes the running tribological surface, rather than the original surface. Finally, the debris effect is to cause total failure of the surface. A typical example of such failure is found in present-day high speed gyros and accelerometers in which flame-sprayed or hot-pressed ceramic materials are employed as wear surfaces. Factors which promote elasto-fractive failure are, for example, brittle materials, high surface speeds, high narrow asperities, low elastic coefficients, low acoustic wave velocity, high melting point and high junction energy.

Figure 4A:
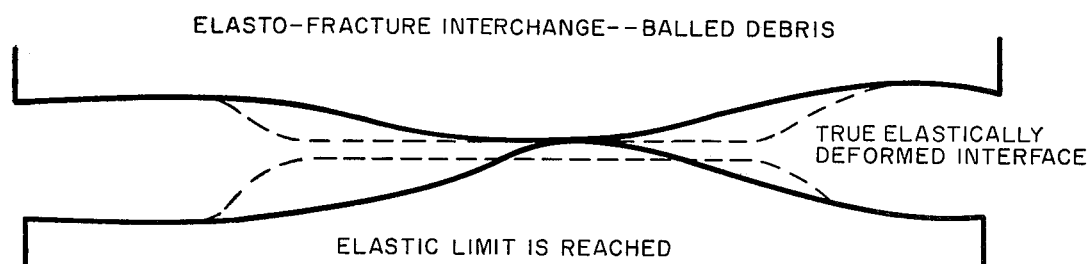
FIGS. 4A and 4B are schematic representations of elastoplastic interchange between the surfaces when the elastic limit has been exceeded.
Figure 4B:
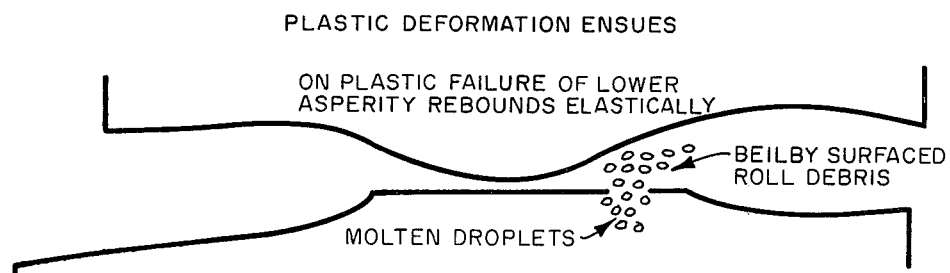

As stated above, elasto-plastic interchange failure is illustrated schematically in FIGS. 4A and 4B. If, for a nonbrittle material, the energy interchange between asperities exceeds the elastic limit, and, if the surface velocity is below sonic velocity for that material, then plastic flow will ensue. The energy involved depends on the plasticity, yield strength, and melting point of the material. Micro-fusion can occur as a secondary effect, but balling of rolled material is normally encountered, and the surface character of this balled material normally displays Bielby surface characteristics or surfacesmear peeling. The side effect of molten droplets being formed, as shown in FIG. 4B, occurs when the local energy level exceeds the melting point of the inner face, and droplets of molten material are dislodged. The characteristics which promote an elasto-plastic interchange are low melting point material, high contact energy, low elastic limit, malleability, and broad low asperity geometry.

Figure 5A:
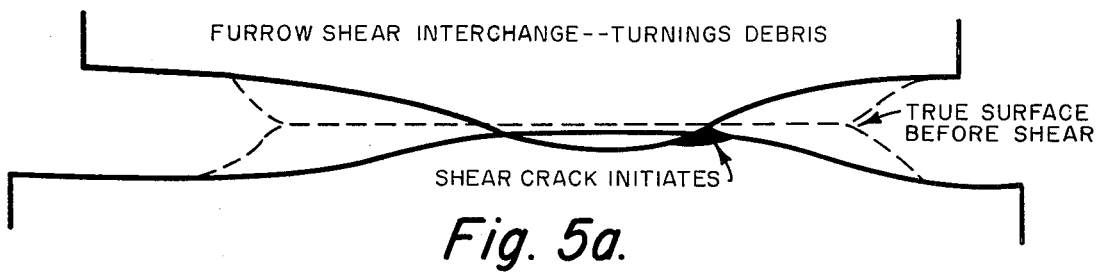
FIGS. 5A and 5B are schematic representations of the state of the surfaces when the shear strength of the material is exceeded.
Figure 5B:
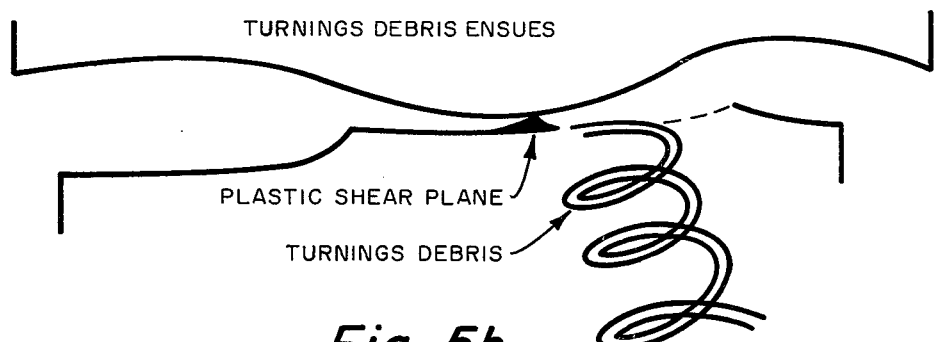
Figure 6A:
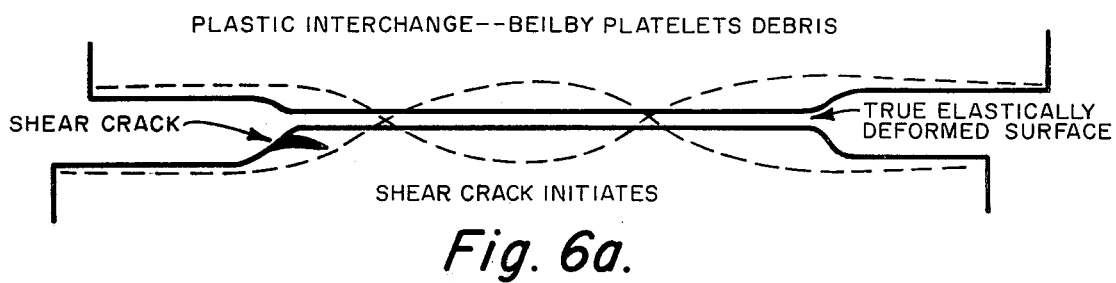
FIGS. 6A, 6B and 6C show schematically the plastic interchange which occurs between the two surfaces when the asperities are brought into contact where high loads are involved and relatively low surface velocity.
Figure 6B:
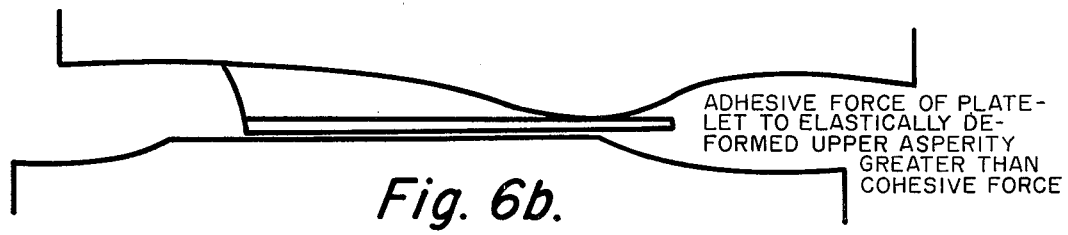
Figure 6C:
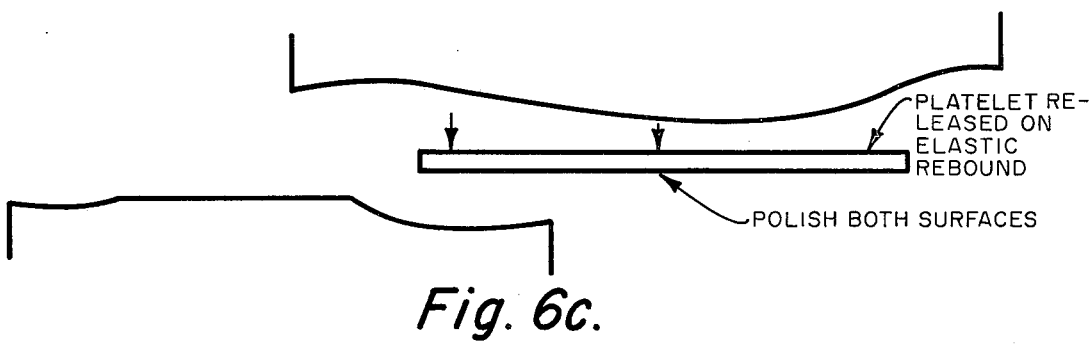

The furrow-shear interchange failure shown schematically in FIGS. 5A and 5B. occurs with the intersection of two asperities of plastically deformable material. If the shear strength of the material is exceeded, and if the surface speed is below the velocity of propagation of an elastic wave in that material, a plastic shear plane will be established, and failure will occur by propagation of that shear plane through the asperity. Since the bulk of the material moves without plastic deformation, the resulting debris appears as turnings rather than balled material, as shown in FIG. 5B. The characteristics which promote furrow shear interchange are ductile material, low shear strength material, high contact junction energy and high narrow asperities.

The plastic interchange shown schematically in FIG. 6 occurs when two asperities of plastic material are brought into contact where high loads and relatively low surface velocities are involved; where junction energy is high; or where the contacting surfaces have previously experienced Bielby layer formation. The effect occurs when the adhesive forces between upper and lower asperities exceed the cohesive force of the material itself. This failure is most likely to occur at the complex interface of the elastically deformed surface in the region of maximum shear. The upper surface of the substratum slips with respect to the lower asperity, and slides between the upper and lower junction zones. The resulting debris exists as flat platelets with polished surfaces on both sides.

From a consideration of the failures described in conjunction with FIGS. 3-6, it may be concluded that ideal tribological surfaces would be composed of extremely hard, refractory, tough, elastic, non-brittle, high strength, and flat surfaces of material with high elastic propagation velocity. In addition, it would be desirable form such surfaces without the introduction of Bielby layers and, when formed, to have the surfaces plastically deformable so that asperity reduction processes can take place without generating micro-fusion, and without introducing microwelding and high contact energy.

However, many of these material requirements are in conflict with one another and cannot be encompassed in a single material. Very hard materials, for example, by their nature are brittle. Very tough material, for example, by their nature are not hard. Brittle materials are non-plastic. However, as evident from the preceding discussion, the requirement for hardness relates only to the surface, and the requirement for toughness or energy absorption capacity relates only to the substrate. It was the recognition of this criteria that led to the concept of the present invention which results in the provision of an ultrathin, ultra-adherent hard film on an appropriate substrate.

As discussed above, the purpose of the process of the invention is to provide a hard surface film whose thickness is in the range of the height of the asperities of the tribological surface involved, and whose function is to distribute the impact load of the asperities over a larger area of the substrate material than that which would be encountered if the overlying film were not present; to absorb substantial portions of the shear load involved in asperity/asperity contact; to offer a low surface interchange energy by maintaining the totally elastic surface interaction; to inhibit micro-fusion energy consumption by employing extremely high temperature hard surface material; and to decrease the unit load on the contact area by progressive diminution of asperity heights by endoplastic processes. By the process of endoplastic deformation, the hard surface material is maintained intact and, as excess energy is inroduced into the substrate material, there is a progressive plastic deformation of the substrate material and a concomitant reduction of asperity height.

The process of the invention provides that the thin film is tenaciously bonded to the substrate surface, and its elastic properties are adequate to maintain full compliacne with the deformed substrate asperity, so that surface contact area is increased without increasing the friction coefficient.

As time progresses, the contact area between the hard film provided by the process of the invention progressively becomes greater than the equilibrium load bearing area experienced in usual elastic interchange. Therefore, the load on the substrate asperities on the average becomes less than their load-bearing limit. In this way, since the contact area is increased, the unit load borne by each asperity becomes less. This unique aspect causes the surface progressively to become a better load-bearing medium as the wear process takes place rather than a deteriorating load-bearing medium, as is the case when the contacting surfaces are not protected by the hard films.

The manner in which endoplastic deformation takes place can best be understood by reference to the force diagram in FIG. 1B. The region of maximum stress during asperity compression is below the surface, and at the intersection of the elastic wave passing through the asperities and the shear wave associated with furrow compression and frictional drag. Since the inclination of an unrestrained asperity contact is to drive an elastic furrow in front of the asperity contact, and since this furrow effect is inhibited by the presence of the asperity with which it is in contact, the shear load is driven below the surface. The hard film inhibits the tendency for this train to be transmitted to the surface, and the energy must then be distributed internally and dissipated thermally and by strain. If the strain exceeds the elastic limit of the substrate material, plastic or permanent deformation occurs. The fully compliant overlaying hard surface film is then conformed elastically with the now reduced asperity height.

Figure 7:
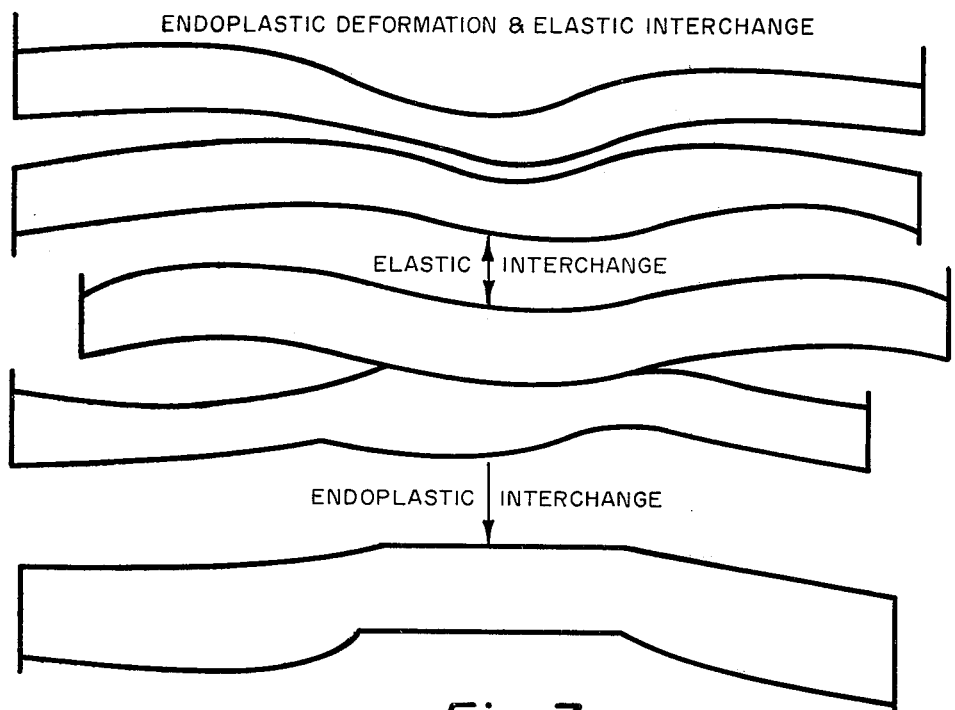
FIG. 7 is a schematic representation of the overall effect of endoplastic deformation when the contacting surfaces are protected by micro-films in accordance with the process of the invention.

A schematic illustration of the overall effect of endoplastic deformation is shown in FIG. 7. As can be seen, surface film of a thickness approximating asperity heights, for example, in the range of 5 micro-inches, is applied to both upper and lower bearing surfaces. In the case where elastic interchange is involved, as can be seen in the center portion of FIG. 7, the point impact load on the asperity is distributed over a substantially larger area of the substrate as a result of the intervening surface film. In those cases where the energy introduced to the substrate asperity exceeds the elastic limit, the plastic deformation occurs, the subsequent surface shown in the lower portion of FIG. 7 then remains flatter than the original asperity surface.

As can be seen in the diagrams of FIG. 7, when two asperities come into contact with one another, and when the surfaces are protected by hard films of microthickness, the contact zone now becomes the interaction points between the two coating surfaces rather than the two substrate asperity surfaces. Since the hard surface films have a high degree of elasticity, they transmit the point impact load to the substrate asperity and, in doing so, the unit load on the asperity is substantially reduced because of the distribution over a larger area of the substrate. When that occurs, the mechanical displacement, the furrow shear and the elastic wave are introduced to the interior of the substrate, and, in those cases where these forces exceed the elastic limit of the top substrate material, the underlying asperity is caused to deform plastically and the energy is dissipated.

By the process of the invention it is possible to maintain the hard surface film fully coherent while inducing microplastic deformation asperity height reductions in the substrate, As such, since the hard surface film is totally compliant with the substratum surface material, the overall supernatant surface becomes smoother. As a direct consequence, as time proceeds, the contact surface becomes larger and the unit load borne by the surface becomes progressively less. This action is referred to herein as endoplastic deformation, and by this action the tribological surface improves as wear proceeds, rather than deteriorates. Still further, as long as the supernatent hard film is maintained, no debris is generated and it is possible to conceive of tribological surfaces which remain essentially indestructible over limitless time periods.

The presently preferred embodiment of the process of the invention comprises the following steps:

A. The tribological surface of a particular substrate is prepared with a surface finish in the range of 15 micro-inches, or less. This substrate is preferably, although not essentially, formed of tough material. For example, beryllium has been used for the substrate, although beryllium is not noted for its wear resistance characteristics, and although beryllium has nearly uniquely poor characteristics as a tribological surface since it is extremely soft and pliable.

B. By use of hollow cathode sputtering devices, or other positive ion scrubbing methods, a portion of the tribological surface of the substrate is removed by reverse sputtering. Reverse sputtering involves the bombardment of the surface by ions normally in the energy range of 100–1000 electron volts. This reverse sputtering process removes surface impurity films and, to a certain extent, dislodges poorly adherent material. The process, in general, activates the surface of the substrate so as to be amenable to the tenacious bonding of an overlaying film.

C. During the initial stages of deposition of the hard surface coating material, for example, oxides, nitrides, borides or silicides of refractory or transition metals, the tribological surface is biased negatively with respect to the hollow cathode sputtering source and, in so doing, causes some of the ionized species of the deposited material to be accelerated into the activated tribological surface. This causes an intimate mechanical bonding between the first layers of the hard surface deposit and the activated surface. This latter process is normally carried out in a range of 100–1000 electron volts and, it serves both to deposit and to remove material simultaneously. Gradually the reverse bias is reduced, but is never fully removed, and the ionized particles are caused continuously to bombard the growing film surface so as to inhibit any tendency for the thin film to crystalize. The level of continuing bias is determined by the nature of the material being deposited and is adjusted so as to insure a low degree of crystal perfection. As an example, for titanium carbide, this process is normally effective with a continuing bombardment in the range of 200 electron volts.

The end effect of the foregoing process is to prepare an ultra-hard film which is intimately bonded to the surface of the substrate, and which has high dislocation density. In some cases where the film material is not prone to crystallize readily, the continuing bias procedure may be eliminated. However, since most of the extremely hard materials are subject to easy crystalication, there is a distinct limit as to how thick the film can be made before near amorphic character can be maintained. It has been found empirically that film thicknesses in the range of less than 15 micro-inches are most appropriate to the class of hard film materials set forth above.

The invention provides, therefore, an improved process for preparing ultra-thin films on a substrate which are thin enough so that the hard surface coating does not achieve its own modulus of rigidity and, as such, does not directly absorb energy but transmits the energy to the substrate material for absorption. The ultra-thin film is adhesively attached to the substrate in a manner so as to have ultra-adherence so that it is fully compliant with the plastic deformation of the substrate material. Also, the process of the invention serves to maintain high dislocation density in the film so as to nullify the possibility of grain boundaries, as explained above.

Tribological surfaces prepared in accordance with the process of the invention can be run without lubrication in many applications over prolonged periods of time, or to enhance wear life when lubrication is used by (a) presenting a more wear resistant substratum and, (b) by offering a stand-by surface which does not require lubrication as a life extender should the lubricant be depleted in a lubricated system. The effect of endoplastic deformation achieved by the process of the invention reduces asperity height and effective friction coefficient as wear process takes place and, as such, friction coefficients do not increase with wear and, in some cases, effectively decrease with wear. The process of the invention enables soft materials, not normally used as bearing materials, to be effectively employed, when coated with the hard films in accordance with the teachings of the invention.

Although a particular process in accordance with the concepts of the invention has been described herein, modifications may be made, and it is intended in the claims to cover the modifications which come within the spirit and scope of the invention.

What is claimed is:

1. A process for providing a tribological surface which comprises depositing a film of a selected material on a substrate of softer material by cathode sputtering, the film having a thickness such that the film is fully elastically compliant and remains intact in the presence of plastic deformation of the substrate meterial, and such that impact energy is transmitted through the film to the substrate to be absorbed entirely by the substrate, and which includes the step of biasing the tribological surface negatively with respect to the cathode sputtering source to an extent sufficient to cause ionized species of the sputtered material to be accelerated onto the tribological surface so as to inhibit any tendency for the film to crystallize, and so as to cause the film to be intimately bonded to the substrate, the improvement wherein the negative bias is initiated at a selected level, and reduced to a lower level as the process proceeds, and maintained at the lower level for the remainder of the process.

2. The process defined in claim 1, in which the film has a thickness not exceeding 15 micro-inches.

3. The process defined in claim 1, and which includes the step of initially preparing the surface of the substrate with a finish having an asperity range not exceeding 15 micro-inches.

4. The process defined in claim 1, and which includes the step of initially removing a portion of the surface of the substrate prior to depositing the film by ion bombardment to remove surface impurities and to activate the surface.

* * * * *